(12) United States Patent
Summers

(10) Patent No.: US 7,759,218 B2
(45) Date of Patent: Jul. 20, 2010

(54) INDENTED LID FOR ENCAPSULATED DEVICES AND METHOD OF MANUFACTURE

(75) Inventor: Jeffery F. Summers, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 85 days.

(21) Appl. No.: 12/285,817

(22) Filed: Oct. 15, 2008

(65) Prior Publication Data

US 2009/0053855 A1 Feb. 26, 2009

Related U.S. Application Data

(62) Division of application No. 11/433,435, filed on May 15, 2006, now Pat. No. 7,462,931.

(51) Int. Cl.
*H01L 21/30* (2006.01)
*H01L 21/00* (2006.01)

(52) U.S. Cl. ............... 438/456; 438/58; 438/118; 438/471; 257/E21.499; 257/E23.137

(58) Field of Classification Search ........... 438/456, 438/58, 118, 471; 257/E21.499, 23.137
See application file for complete search history.

(56) References Cited

U.S. PATENT DOCUMENTS

| 4,306,887 | A |  | 12/1981 | Barosi et al. |
| 4,312,669 | A |  | 1/1982 | Boffito et al. |
| 4,907,948 | A |  | 3/1990 | Barosi et al. |
| 5,961,750 | A |  | 10/1999 | Boffito et al. |
| 6,004,450 | A |  | 12/1999 | Northrup et al. |
| 6,062,461 | A |  | 5/2000 | Sparks et al. |
| 6,338,284 | B1 | * | 1/2002 | Najafi et al. ............... 73/866.1 |
| 6,806,557 | B2 | * | 10/2004 | Ding .......................... 257/659 |
| 6,822,880 | B2 |  | 11/2004 | Kovacs et al. |
| 6,844,959 | B2 |  | 1/2005 | Huibers et al. |
| 6,897,469 | B2 |  | 5/2005 | Syllaios et al. |
| 6,923,625 | B2 |  | 8/2005 | Sparks |
| 6,929,974 | B2 | * | 8/2005 | Ding et al. .................. 438/106 |
| 6,988,924 | B2 |  | 1/2006 | Ramamoorthi et al. |
| 7,204,737 | B2 | * | 4/2007 | Ding et al. .................... 445/24 |
| 2004/0061207 | A1 | * | 4/2004 | Ding .......................... 257/678 |
| 2005/0118920 | A1 | * | 6/2005 | Lefort et al. ................... 445/24 |
| 2006/0063462 | A1 | * | 3/2006 | Ding et al. ..................... 445/25 |
| 2007/0048898 | A1 |  | 3/2007 | Carlson et al. |
| 2007/0238262 | A1 |  | 10/2007 | Summers |
| 2009/0053855 | A1 |  | 2/2009 | Summers |

* cited by examiner

*Primary Examiner*—Nitin Parekh
(74) *Attorney, Agent, or Firm*—Jaquelin K. Spong

(57) ABSTRACT

A method for providing improved gettering in a vacuum encapsulated device is described. The method includes forming a plurality of small indentation features in a device cavity formed in a lid wafer. The gettering material is then deposited over the indentation features. The indentation features increase the surface area of the getter material, thereby increasing the volume of gas that the getter material can absorb. This may improve the vacuum maintained within the vacuum cavity over the lifetime of the vacuum encapsulated device.

19 Claims, 10 Drawing Sheets

INDENTED LID FOR ENCAPSULATED DEVICES AND METHOD OF MANUFACTURE

CROSS REFERENCE TO RELATED APPLICATIONS

This application is a divisional of U.S. patent application Ser. No. 11/433,435, filed May 15, 2006 and incorporated by reference herein in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to encapsulated integrated circuit and microelectromechanical systems (MEMS) devices. More particularly, this invention relates to the prevention, reduction, elimination or purification of outgassing and trapped gases in such devices.

The ability to maintain a low pressure or vacuum for a prolonged period in a microelectronic package is increasingly being sought in such diverse areas as display technologies, micro-electro-mechanical systems (MEMS) and high density storage devices. For example, computers, displays, and personal digital assistants may all incorporate devices which utilize electrons to traverse a vacuum gap to excite a phosphor in the case of displays, or to modify a media to create bits in the case of storage devices, for example.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. One example of a MEMS device is a microfabricated cantilevered beam, which may be used to detect the presence of a particular material, for example, a biological pathogen, or which may be used in a high-Q gyroscope. By coating the MEMS cantilever with a suitable reagent, the pathogen may bind with the reagent resulting in mass added to the cantilevered beam. The additional mass may be detected by measuring a shift in the characteristic vibration frequency of the cantilevered beam. However, because air is viscous, the cantilevered beam may be required to operate in a vacuum, so that the viscosity of ambient air does not broaden the resonance peak. Accordingly, MEMS devices such as cantilevered beams may also require vacuum packaging, in order to increase the signal-to-noise level of the detector to an acceptable level.

The packaging of the MEMS device may be accomplished by bonding a lid wafer with a device wafer. The MEMS devices, such as the cantilevered beams, are first fabricated on the device wafer. The lid wafer is then prepared by etching trenches or cavities in the lid wafer which will provide clearance for the MEMS device on the device wafer. Before bonding, the lid wafer is aligned with the device wafer, so that the device cavity in the lid wafer is registered above the device on the device wafer, providing clearance for the height of the MEMS device and for its anticipated range of motion.

The lid wafer and device wafer assembly may then be loaded into a wafer bonding chamber, which is then evacuated. The lid wafer is then permanently bonded to the device wafer with a hermetic bond, so that the evacuated environment within the device cavity does not equilibrate with the outside environment by leakage over time.

One of the major problems with vacuum packaging of electronic devices, including MEMS is the continuous outgassing of hydrogen, water vapor, carbon monoxide, and other components found in ambient air, and from the internal components of the electronic or MEMS device. Typically, to minimize the effects of outgassing, one uses gas-absorbing materials commonly referred to as getter materials. Generally a getter material is a metal alloy, for example, an alloy of zirconium (Zr), vanadium (V), and iron (Fe) that is sputter deposited on the surface of the lid wafer. The getter material may then be activated by heating to a predefined temperature, so that the getter desorbs or diffuses the gases already absorbed and is ready to function in the device.

In order to maintain a low pressure, over the lifetime of the vacuum device, a sufficient amount of exposed surface area of the getter material may need to be installed within the package before it is sealed. Accordingly, in order to absorb a larger volume of gas or achieve a lower base pressure, a larger amount of exposed getter material may need to be enclosed in the cavity. This may be a particular problem for the large cavities often disposed above MEMS devices, which may enclose volumes of several cubic millimeters. However, increasing the amount of getter material may increase the size of the device package, and therefore increase its cost.

Alternatively, designs have been proposed which apply getter materials in a cavity which may be located outside the device cavity, but connected to the device cavity by a conduit formed in the device wafer or lid wafer, such that the getter cavity and the device cavity are in gaseous communication with one another. U.S. Pat. No. 6,499,354 describes such a getter cavity in conjunction with a semiconductor microstructure device. However, the need for a getter cavity may increase the die size and therefore also increase the required pitch between devices. As a result, this approach may increase the cost of manufacturing such devices, by reducing the number of devices which can be fit on a wafer substrate.

Accordingly, a design is needed that provides improved gettering without increasing the size of the device package.

SUMMARY

The volume of gas that a getter can absorb may be proportional to its surface area. In order to increase the surface area of the getter, the lid may be prepared with a plurality of small indentations or recesses, on which the getter material may be deposited. Since the indentation features effectively increase the surface area of the getter material, without increasing the size of the device cavity, the volume of gas that the getter may absorb is increased, while the base pressure that can be maintained within the package is decreased.

The systems and methods therefore include forming an indented lid by forming a cavity in a lid wafer, and forming at least one indentation feature on at least a portion of a surface of the cavity of the lid wafer. The systems and methods may further include depositing the getter over the at least one feature, evacuating the device cavity and sealing the device cavity against a device wafer.

In various exemplary embodiments, the at least one indented feature may be at least one of an array of blind holes, a set of grooves and a set of trenches. The walls of the grooves or trenches may have any of a number of shapes, such as trapezoidal, saw tooth and sinusoidal. The shape of the sidewalls of the grooves or trenches may reflect the technique used to form the grooves or trenches. For example, a wet etching technique used to form the grooves or trenches may result in a trench sidewall forming an angle of 57 degrees with respect to a line parallel to a plane of the lid wafer.

Because the indented lid has a larger surface area than the non-indented lid, the getter material deposited over the indented lid may have improved gettering performance. Devices using the indented lid for deposition of the getter may achieve, therefore, lower base pressures within the evacuated region of the device cavity, over the lifetime of the device.

These and other features and advantages are described in, or are apparent from, the following detailed description.

BRIEF DESCRIPTION OF THE DRAWINGS

Various exemplary details are described with reference to the following figures, wherein.

DETAILED DESCRIPTION

The systems and methods described herein may be particularly applicable to vacuum encapsulated microelectromechanical (MEMS) devices, however, they may also be applicable to any integrated circuit formed on a device wafer and encapsulated with a getter material on a lid wafer.

Figure 1:
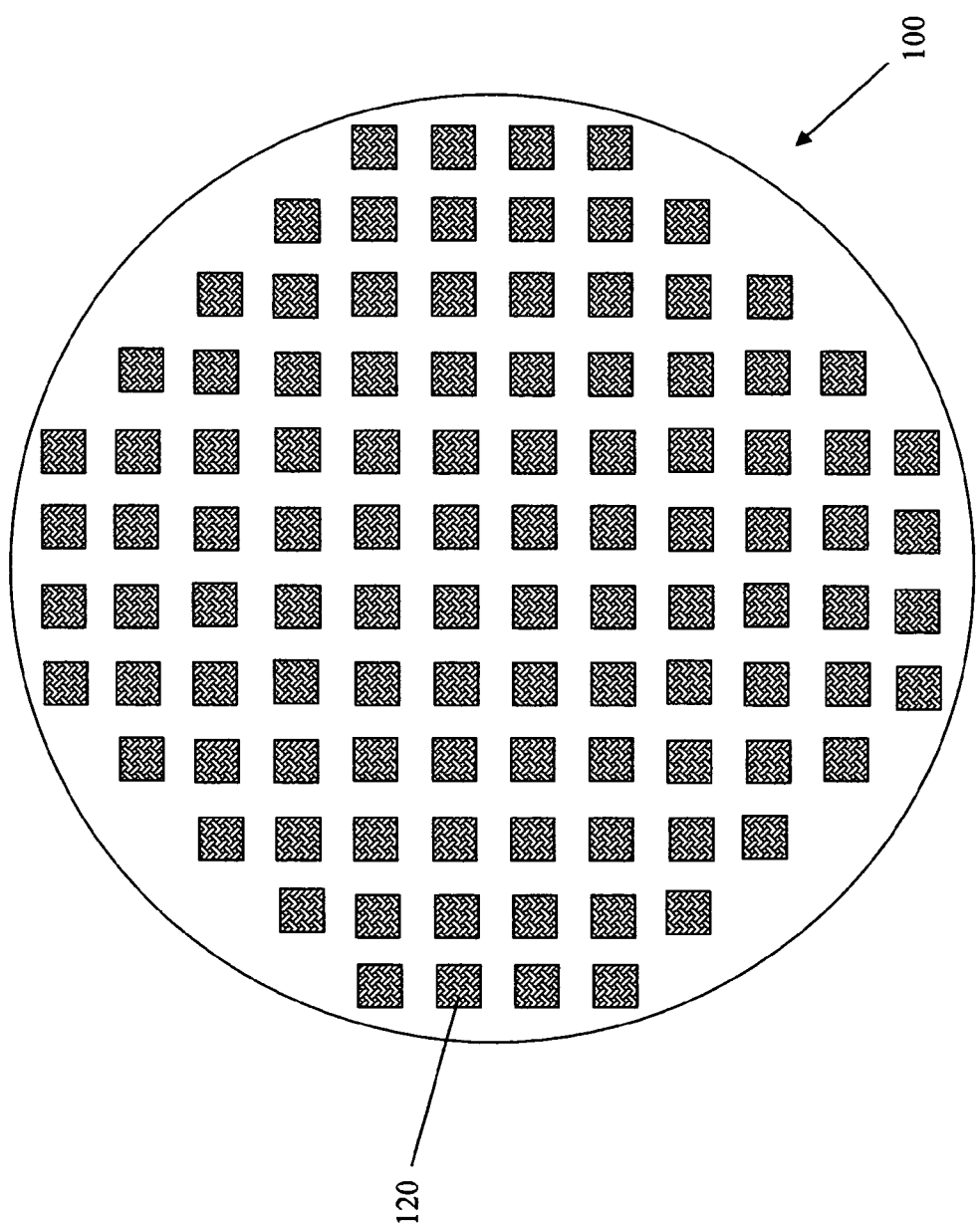
FIG. 1 is a plan view of an exemplary device wafer.

FIG. 1 is a diagram of an exemplary device wafer 100, upon which a plurality of MEMS devices 120 may be fabricated. The MEMS devices may be for example, sensors, actuators, detectors, switches, cantilevers, or the like. The MEMS devices 120 may have a device pitch of, for example, about 10 mm so that about 12 MEMS devices may fit within a six inch device wafer 100. It should be understood that this situation is exemplary only, and that the MEMS devices may in general be much smaller, and that this relatively large size is shown for ease of depiction.

The device wafer 100 may be composed of any number of satisfactory substrate materials, such as silicon, gallium arsenide, silicon-on-insulator (SOI), glass, sapphire, quartz, ceramic, metal or the like. The lid wafer 200 may be glass, Kovar, Invar, silicon, metal, or ceramic, for example. In one embodiment, the device wafer 100 is silicon, 675 μm thick, and the MEMS device 120 is a cantilevered thermal switch, such as that described in U.S. application Ser. No. 11/263,912 (IMT-ThermalSwitch, the '912 application), incorporated by reference herein in its entirety. A plurality of like MEMS devices 120 may be formed on the surface of the device wafer 100, using, for example, surface machining processes. For example, a cantilevered MEMS device may be fabricated by first plating a sacrificial copper layer, then plating a cantilevered nickel beam over the sacrificial copper layer. Finally, after removing the sacrificial copper layer, the nickel beam is free to bend about its anchor point. Further details as to the fabrication of a thermal switch as the MEMS devices 120 are set forth in the incorporated '912 application. However, it should be understood that the MEMS devices 120 may be any of a number of devices other than the switch described in the incorporated '912 application, such as accelerometers, sensors, actuators, and the like. Since the details of the MEMS devices 120 are not necessary to the understanding of the systems and methods described here, they are depicted only schematically in FIGS. 1 and 4.

Figure 2:
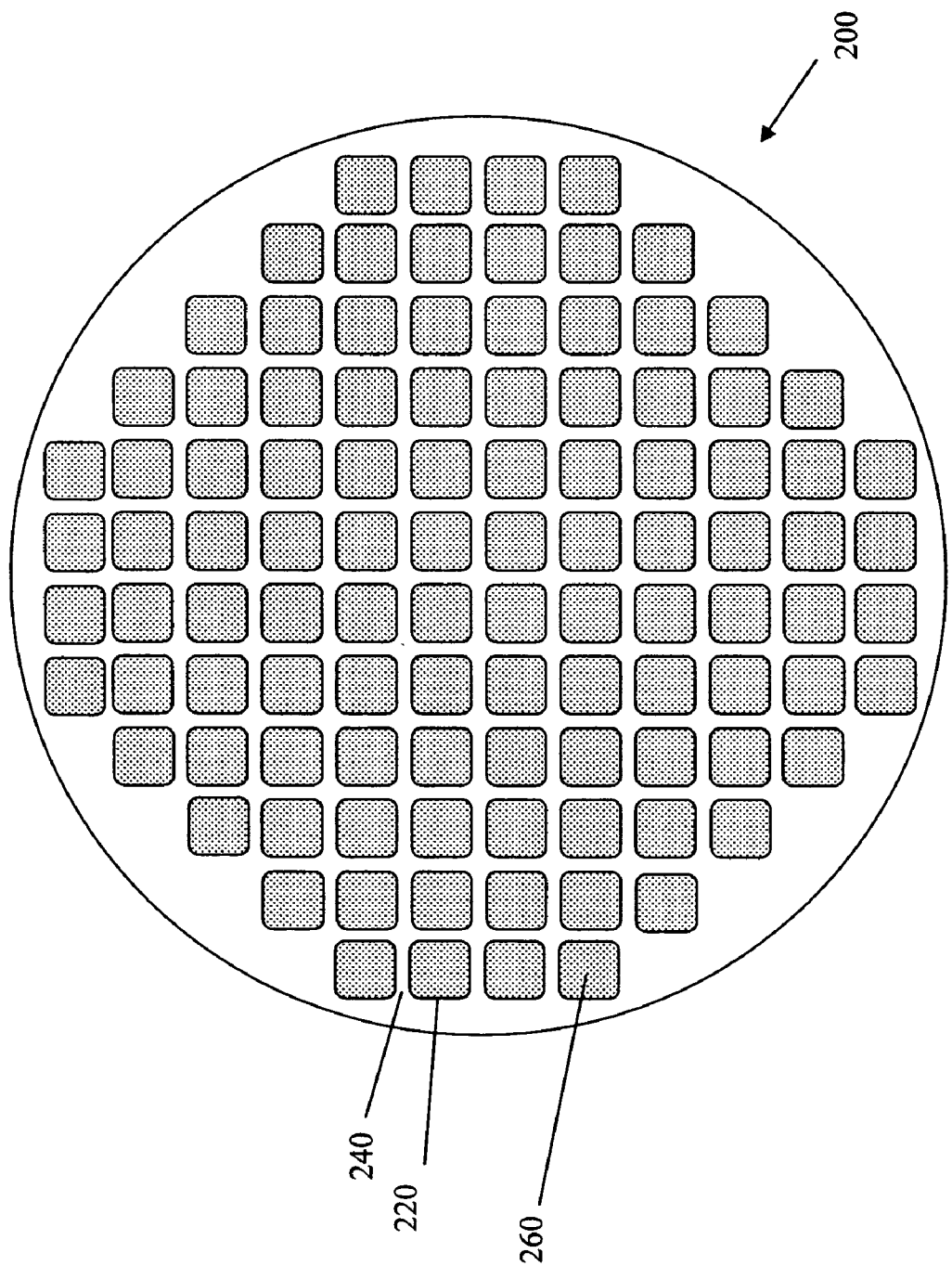
FIG. 2 is a plan view of an exemplary lid wafer, showing indentation features in the device cavities according to a first exemplary embodiment.

FIG. 2 is a diagram of an exemplary lid wafer 200 with a plurality of device cavities 220 formed therein. A "lid" wafer should be understood to mean a wafer which provides encapsulation for a device formed on a device wafer, and may or may not have any additional active structures on it. The device cavities 220 in the lid wafer 200 may be used to encapsulate the MEMS devices 120 formed on the device wafer 100, when the lid wafer 200 is sealed against the device wafer 100. Accordingly, the pitch of the device cavities 220 may be the same as the pitch of the MEMS devices 120 formed on the device wafer 100. The device cavities 220 may be formed on one side of the lid wafer using a dry etch process, such as deep reactive ion etching (DRIE) or reactive ion etching (RIE). However, the device cavity 220 may also be formed using a cheaper, wet process such as a liquid chemical etch. For example, the lid wafer 200 may first be covered with photoresist and patterned to expose the portions of the lid wafer 200 which will be removed to form the device cavities 220. The photoresist may be developed, and the lid wafer submerged in a solution of potassium hydroxide (KOH) solution to etch the device cavities 220 to a depth of about 150 μm. It should be understood that any other depth may be chosen, in order to give adequate clearance for the movement of the MEMS device. The span of the cavity is chosen to allow an adequate perimeter around the MEMS device and room for its movement, while still minimizing the wafer area lost to such overhead. The width of the device cavity may be, for example, about 6 mm.

The chemical etching may be isotropic, and may form the device cavity 220 in the lid wafer with a wall slope of about 57 degrees, that is, the angle defined by the sidewall and a line parallel to the plane of the wafer is about 57 degrees.

Within each device cavity may be a plurality of indentation features 260. The term "indentation feature" should be understood to mean one or more features formed on a surface of at least a portion of the device cavity, which extend to some depth into or out from the lid wafer, such that their sidewalls give the device cavity more surface area than it would otherwise have. The word "indentation" is therefore not intended to refer to a specific shape of a hole or groove, but may instead refer to any feature which may be formed as one or more depressions in the device cavity surface. The indentation features 260 may be an array of blind holes, for example, etched into the device cavity surface. Furthermore, the term "indentation feature" may also refer to a feature formed by the deposition of material on the lid wafer, in order to form a set of pillars or posts, providing additional surface area. Such deposited indentation features may be formed by electroplating or ion beam deposition of the additional material onto the surface of the lid wafer. In general, the indentation features are substantially smaller than the dimensions of the device cavity, such that a plurality of indentation features may be placed within a single device cavity. For example, a characteristic dimension of the indentation features may be at least about ten times smaller than the width of the device cavity.

The blind holes 260 may be etched before or after the device cavity is etched. For example, the plurality of holes 260 may be formed on the otherwise flat surface of the lid wafer, before the formation of the device cavity 220. The holes 260 may be formed by, for example, patterning photoresist and DRIE or wet etching the lid wafer through the apertures in the patterned photoresist. Photoresist may then be reapplied to the lid wafer and patterned in areas corresponding to the device cavity. The device cavity may then be formed by DRIE or wet etching the surface which formed the lands between the plurality of small holes 260. In other exemplary embodiments, the indentation features may be formed in the device cavity surface when the lid wafer 200 is stamped or molded.

Alternatively, in another exemplary embodiment, the indentation features 260 may be formed after the device cavity 220 has been etched. After forming the device cavity 220, photoresist is reapplied to the lid wafer surface and patterned according to the locations and shapes of the indentation features 260. The indentation features 260 are then etched into the surface of the device cavity 220 using, for example, DRIE or wet etching.

Other alternative methods for making the indentation features 260 include ion milling and dry etching. Finally, the indentation features may be made by depositing material on the lid wafer 200. For example, features such as posts, columns or pillars may be deposited by electroplating or ion beam deposition, to create the indentation features.

Figure 3:
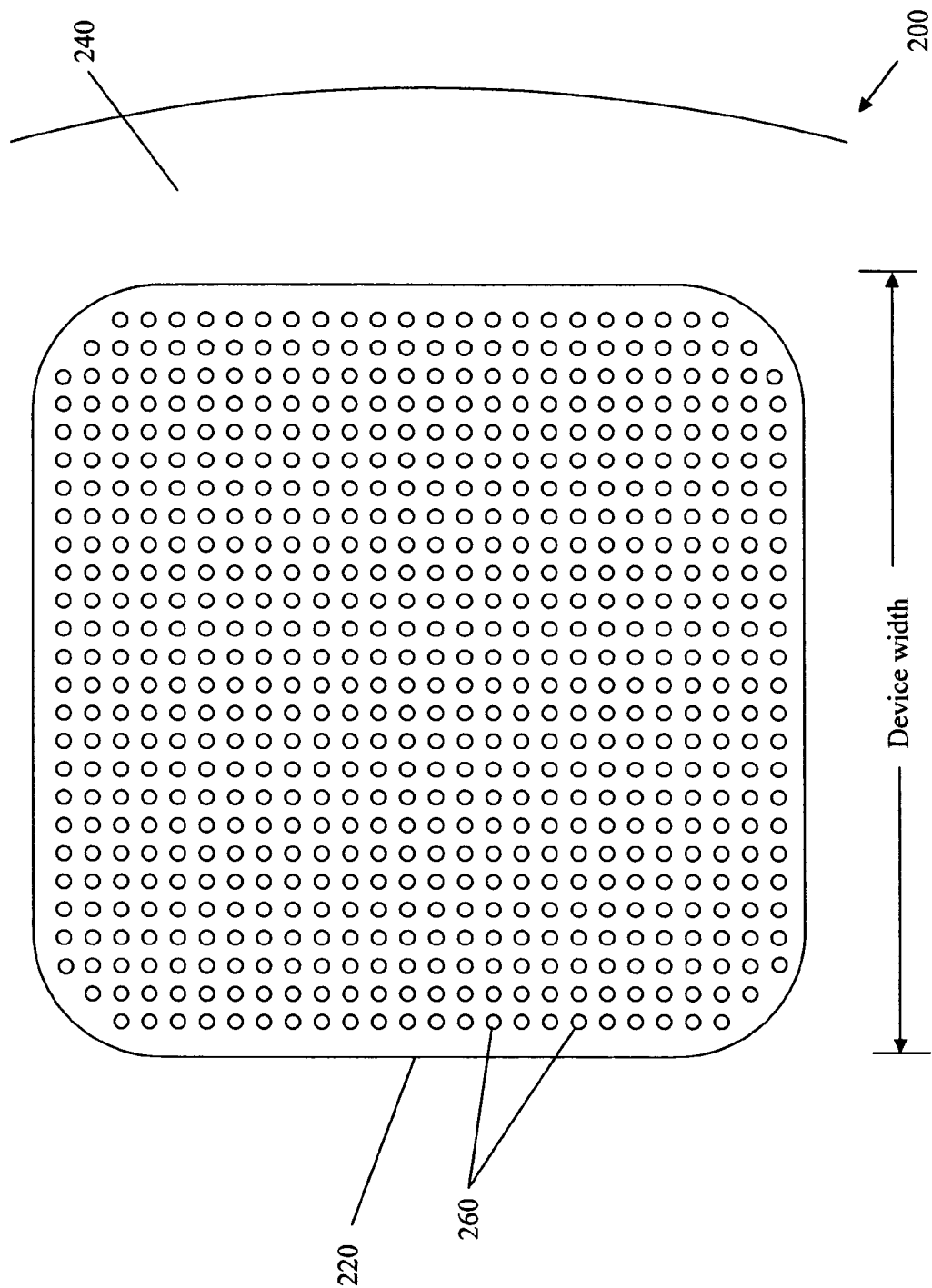
FIG. 3 is a plan view of the exemplary lid wafer of FIG. 2 in greater detail.

FIG. 3 is a plan view showing the exemplary lid wafer 200 in greater detail. The indentation features 260 are shown in the device cavity 220. According to FIG. 3, about 650 of the indentation features 260 may fit within the device cavity 220, with the device cavity 220 being about 6 mm in width. Accordingly, the indentation features may have a pitch of about 6 to about 250 µm or larger. For ease of depiction, the indentation features are depicted as being relatively large, having a diameter of about 100 µm. The only limit on the diameter of the indentation feature may be that a fewer number of them will then fit within the device cavity, reducing the amount of surface area added to the getter film. However, it should be understood that the indentation features may be much smaller, with a diameter of about 6 µm, for example.

Although FIGS. 2 and 3 show the indentation features formed only within the device cavity, it should be understood that the indentation features may also be formed outside of the device cavity, for example, over the entire surface of the lid wafer, as long as they do not interfere with the formation of a seal between the lid wafer and the device wafer. The seal between the lid wafer and the device wafer may be formed by applying an adhesive to surface 240 shown in FIGS. 2 and 3. The adhesive may be any material capable of forming a hermetic or vacuum seal between the lid wafer and the device wafer, thereby enclosing the device 120 within an evacuated device cavity 220. One example of a suitable adhesive is a glass frit with embedded rigid particles, as described in co-pending U.S. patent application Ser. No. 11/390,085 (IMT—Standoff), incorporated by reference herein in its entirety.

Figure 4:
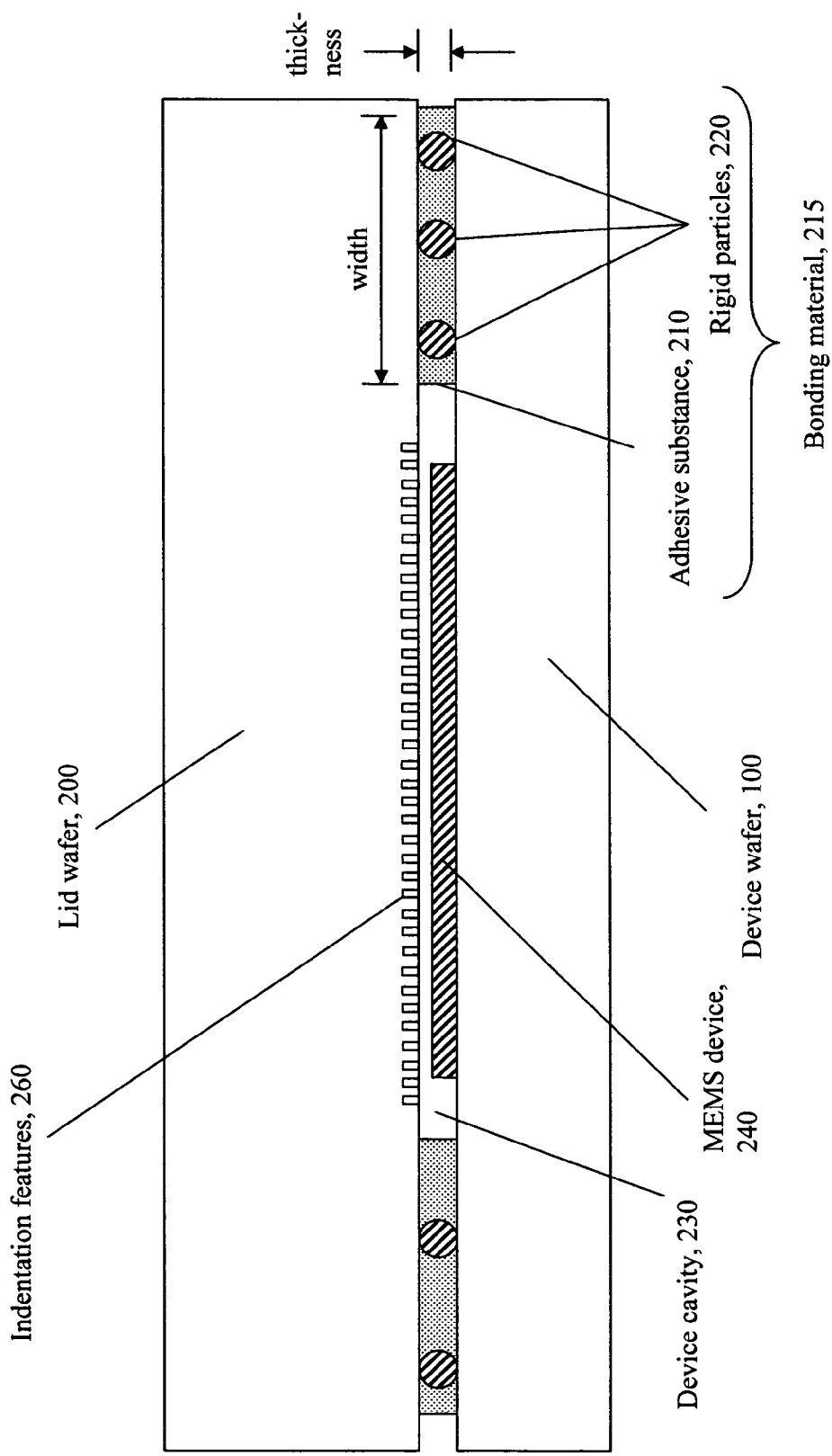
FIG. 4 is a cross sectional view of the indentation features used with a bonding material with embedded rigid particles defining the separation between substrates.

As described in the incorporated '085 application and illustrated in FIG. 4, a bonding material 215 may be applied to an unetched surface of the lid wafer, and in a perimeter around the device cavity and MEMS device 120. The bonding material 215 may include an adhesive substance 210 with embedded rigid particles 220. The bonding material 215 may be applied to one or both of the lid wafer and device wafer by, for example, using silk screening techniques. In one embodiment, the bonding material 215 is forced through a patterned silk screen or a stencil with a squeegee onto the surface of lid wafer. Alternatively, the bonding material may be deposited by dipping, spraying, painting, or extrusion. The thickness of the bonding material 215 as applied (before assembly with the device wafer) may be about 25 µm to about 30 µm. The width of the bonding material as applied may be about 125 µm. The adhesive substance of the bonding material 215 provides the adhesion forces necessary to bond the lid wafer 200 to the device wafer 100, and the rigid particles 220 define the minimum separation between the lid wafer 200 and the device wafer 100. Since the rigid particles 220 define the minimum spacing, this separation may define the device cavity 230, and a substantially flat lid wafer 200 may be used, as shown in FIG. 4. The indentation features 260 may then be formed on the surface of this wafer. The lid wafer material 200 may be glass, Kovar, Invar, silicon, metal, or ceramic.

The embedded rigid particles 220 may be spherical in shape, with diameters of between about 1 µm and about 100 µm. In this embodiment, the embedded rigid particles are sapphire spheres of at least about 10 µm diameter. Accordingly, the minimum distance between the lid wafer 200 and the device wafer 100 may be the diameter of the sapphire spheres, or 10 µm. The width of the bonding material 215 after the bonding of the lid wafer 200 to the device wafer 100 may be about 200 µm.

While an embodiment of the bonding material 215 with embedded rigid particles 220 is described as a glass frit paste mixed with sapphire spheres, it should be understood that any of a number of different materials may be used as the adhesive substance or as the rigid particles. Any adhesive substance which is liquid or may become molten during processing, and is capable of adhering the surface of the lid wafer to the surface of the device wafer, may be used as the adhesive substance. For example, a solder material, which melts at between about 150 and about 200 degrees centigrade may be used. Metal materials, such as indium, gallium/indium, gold/tin and gold/indium, alloys may be used as a lower temperature adhesive substance, or in applications wherein a conductive seal is desired. In other applications not necessarily requiring a hermetic seal, a glue, cement or epoxy may be used as the adhesive substance. The rigid particles may also be alumina, silica (glass), metal or diamond, rather than sapphire.

Figure 5:
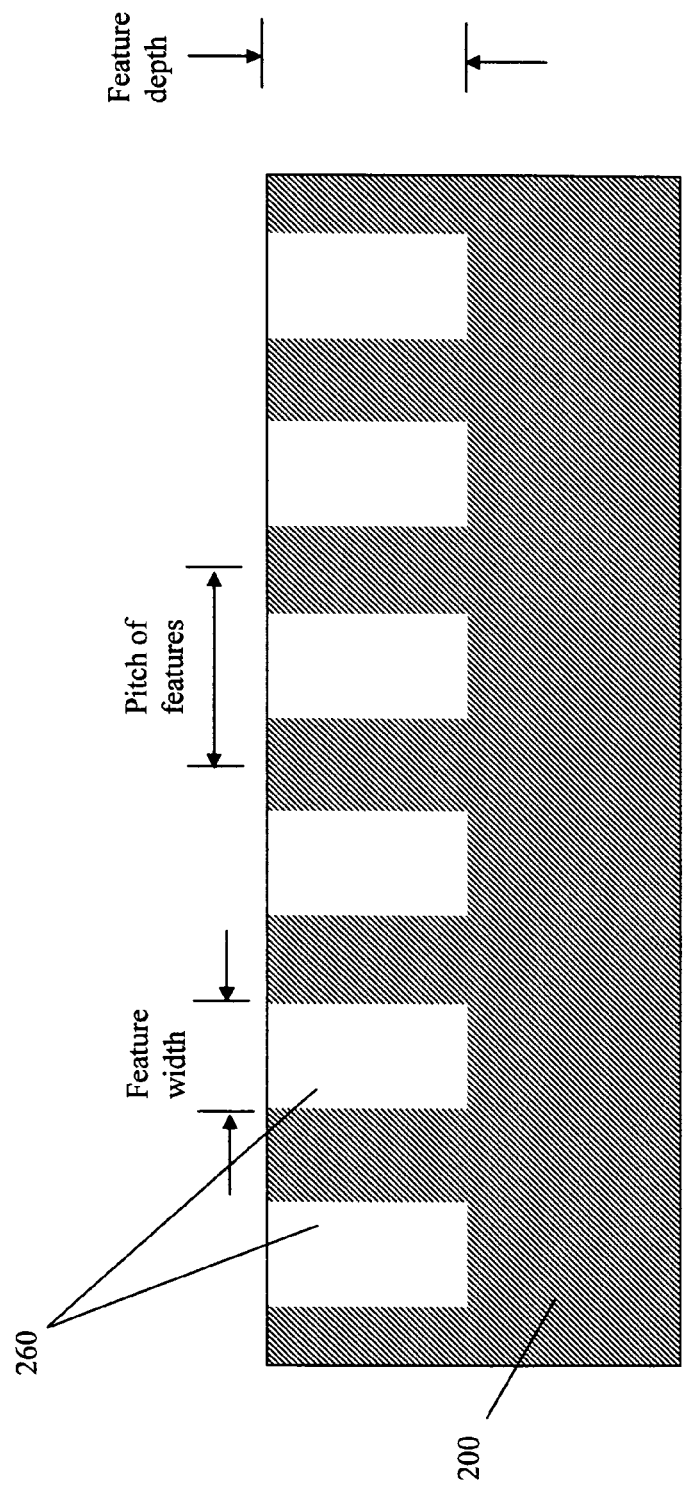
FIG. 5 is a cross sectional view of the indentation features in the device cavity of the lid wafer in greater detail.

FIG. 5 is a cross sectional view showing the detailed dimensions of the indentation features 260. In this exemplary embodiment, the indentation features are blind holes having a depth of about 8 µm and a diameter of about 6 µm. Accordingly, the aspect ratio, defined as the depth divided by the diameter of indentation features, is about 1.33 to 1. More generally, the indentation features may have aspect ratios less than about 3 to 1, and more preferably, less than about 2 to 1. For example, the blind holes may have diameters of about 5 µm to about 100 µm, and depths of about 8 µm to about 200 µm, with aspect ratios of about 2 to 1. More preferably, the blind holes may have a diameter of about 5 µm to about 10 µm, and a depth of about 8 µm to about 20 µm. The 2 to 1 aspect ratio may be the largest which will yield a deposited getter film having sufficient thickness to cover the sidewalls of the indentation features with a substantially uniform film, because of the self-shadowing effect of the sidewalls of the indentation feature 260 on the ends of the sidewall near the end of the blind hole. If the aspect ratio exceeds about 3 to 1, the coverage of the getter film may become excessively thin, particularly deep in the hole near the blind end, or not cover the sidewall uniformly.

Although specific dimensions are described for the formation of the array of blind holes, it should be understood that these dimensions are exemplary only, and that any of a range of other dimensions may be chosen, depending on the requirements of the application. Accordingly, the invention should not be limited to these particular embodiments.

In various exemplary embodiments, the indentation features 260 are disposed in a rectangular array. The pitch between the indentation features 260 may be nearly the diameter of the blind holes, such that their outer diameters nearly touch. Alternatively, the blind holes may be placed at a distance of about twice the diameter of the blind holes, such that the outer walls of the blind holes do not touch. The larger separation may result in a lid of greater mechanical strength which may resist cracking during further downstream handling and processing, although there will be less surface area available for the getter material 270 in this embodiment. The indentation features 260 may alternatively be disposed in a close-packed hexagonal array, or any other regular or irregular pattern.

Although the plurality of indentation features shown in FIGS. 3-5 are all shown to be identical, and placed with the same pitch between them, it should be understood that this embodiment is exemplary only, and that other embodiments may be envisioned, wherein the plurality of indentation features has different shapes or is disposed with different separations within the array. For example, indentation features may be packed in a rectangular array with a specified pitch in one area of the array, and another pitch in another area of the array. For example, the indentation features may be placed closer together to provide more surface area in areas of the array which are near a structure known to outgas. In areas of the array further away from such structures, the indentation features may be placed further apart. In addition, the blind holes may be combined with other indentation shapes, such as trenches or grooves, described in more detail below. The indentation features also need not be circular, but may have any non-circular shape as well.

Figure 6:
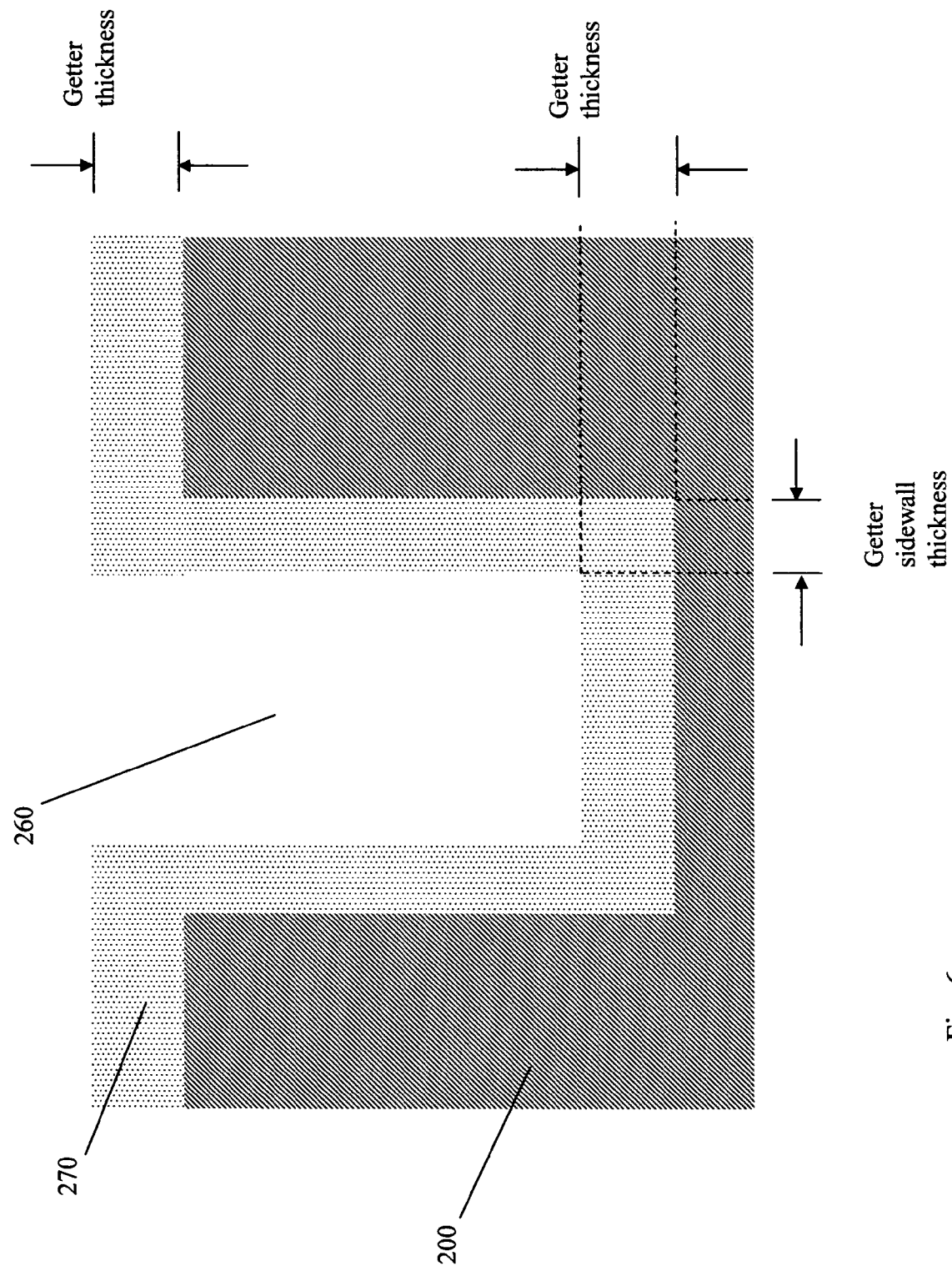
FIG. 6 is a cross sectional view of the indentation features in the device cavity of the lid wafer in greater detail, showing the deposition of the getter film.

Having completed the formation of the lid wafer device cavity 220 with indentation features 260, the lid wafer 200 may then have the getter material 270 deposited thereon, as shown in FIG. 6. The deposition of the getter material 270 may be performed, for example, according to the systems and methods described in U.S. Pat. No. 6,897,551, incorporated by reference herein in its entirety. The getter material 270 may include, for example, zirconium, titanium, vanadium, iron, niobium or tantalum, or alloys thereof combined with other transition elements, rare earths or aluminum. Such materials have a strong chemical affinity towards gases such as hydrogen, oxygen, water, organics, carbon oxides and in some cases nitrogen. Known getter materials are described in, for example, U.S. Pat. Nos. 4,312,669 and 5,961,750, incorporated by reference herein in their entirety. The alloys described therein are manufactured and sold by SAES Getters S.p.A. of Milan, Italy. These materials may therefore remove such gases from the device cavity 220 by absorption, after the lid wafer 200 is bonded to the device wafer 100. The metals or metal alloys of the getter material may be formed into pellets and then sintered to form a metal or metal alloy target. The target material may then be deposited on the lid wafer by sputter deposition through a shadow mask onto the prepared lid wafer 200. The getter film 270 may be sputtered over the indentation features uniformly, as shown in FIG. 6, forming a film about 2 µm thick on the top surface and blind end of the indentation feature 260, and a film about half this thickness, or about 1 µm along the sidewalls of the indentation feature 260. More generally, the getter film 270 may be between about 0.1 µm and about 3 µm thick. At thinner film thicknesses, the amount of impurity gas absorbed may be reduced. At thicker film thicknesses, the getter film 270 may tend to delaminate from the lid wafer 200. In general, as the aspect ratio of the indentation feature becomes bigger, the thickness of the getter film 270 on the sidewall becomes thinner. As was mentioned previously, indentation features with aspect ratios of about 2 to 1 are appropriate in shape for the deposition of a continuous getter film 270 by sputter deposition. Other deposition techniques may allow larger aspect ratios, for example, directional deposition techniques, such as ion beam sputter deposition may be applied and the wafer rotated to obtain a continuous film within a relatively deep indentation feature.

The getter film 270 may be deposited with a layer of gold (not shown) covering the getter film 270. The purpose of the gold film may be to prevent the getter film from absorbing impurity gasses and becoming saturated, before it is installed in the device cavity 220 over the MEMS device 120. After installation in the device cavity 220 as described below, the getter film 270 with the gold layer may be heated to a temperature at which the gold film diffuses into the getter film 270, exposing the surface of the getter film to the environment in the device cavity 220. At this point, the getter film may begin its operation. Alternatively, the getter film 270 on the lid wafer 200 may be heated to desorb any absorbed gases, before installation with the devices 120 on the device wafer 100.

Figure 7:
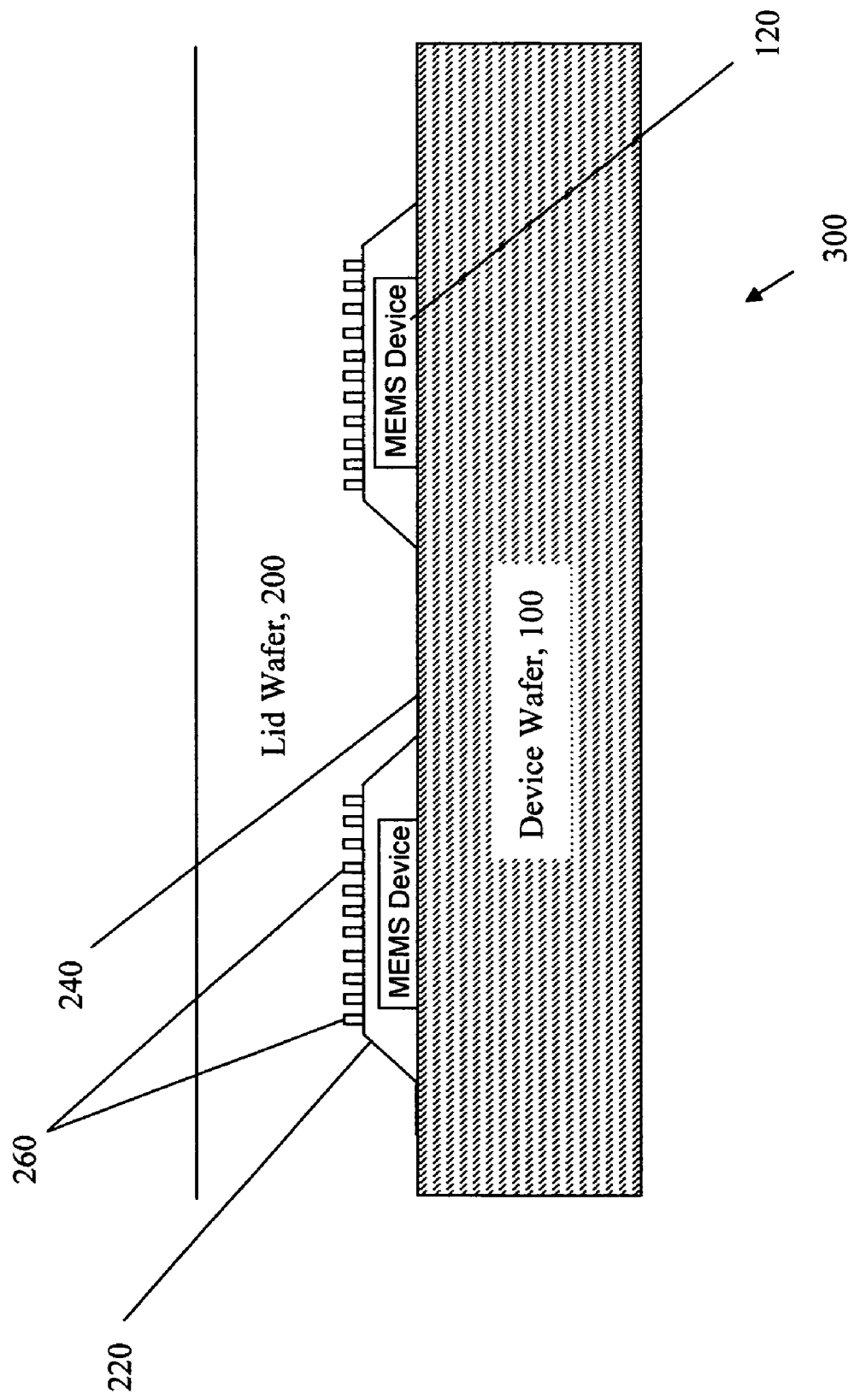
FIG. 7 is a cross sectional view of an exemplary lid wafer and device wafer assembly.

Having deposited the getter film 270 over the indented lid wafer 200, the lid wafer 200 is ready for assembly with the device wafer 100. The lid wafer 200 may first be aligned to the device wafer 100, so that the device cavity 220 is properly registered over the device 120. With the lid wafer 200 in the adjusted position relative to the device wafer 100, the lid wafer 200 may be clamped to the device wafer 100, to form a wafer assembly 300, shown in FIG. 7. The wafer assembly 300 may then be loaded into a wafer bonding tool, which is then evacuated or may have the ambient air replaced with a preferred gas environment. Useful gas environments may include sulfur hexafluoride ($SF_6$), nitrogen ($N_2$), helium (He), argon (Ar), and neon (Ne). The environment may include vacuum and partial vacuum and high gas pressures, in excess of an atmosphere. In the case of the low pressure environments, the getter film 270 may operate to reduce or eliminate unwanted contaminants such as oxygen, water vapor, carbon oxides and organics such as methane from the gas environment. In the case of the vacuum or partial vacuum environment, the getter film 270 may operate to reduce the overall base pressure in the device cavity 220, due to outgassing of various impurities from the lid wafer 200 or device wafer 100, or from the components of the devices 120. In a high pressure noble gas environment, the getter may be used to remove unwanted impurities from the environment.

The wafer bonding tool may be equipped with a wafer chuck to hold the wafer assembly 300 and a pressure chuck which may apply pressure to the wafer assembly 300. The wafer bonding tool may also have a heat source, which may apply heat to the adhesive that may bond the lid wafer 200 to the device wafer 100. For example, if the adhesive is a glass frit, the wafer bonding tool may heat the wafer assembly 300 to a temperature of about 450 degrees centigrade for at least about 10 minutes, and apply a force between the lid wafer 200 and the device wafer 100 of about 50 N to about 4000 N. This heating step for sealing the adhesive may also serve to diffuse the gold layer over the getter film 270, as described above, to activate the getter film 270. After the lid wafer 200 is sealed with the device wafer 100, enclosing either the preferred gas or vacuum within the device cavity 220, the wafer assembly 300 may be removed from the wafer bonding tool. The individual devices 120 may then be singulated from the device wafer 100, to form the encapsulated individual device packages.

Figure 8:
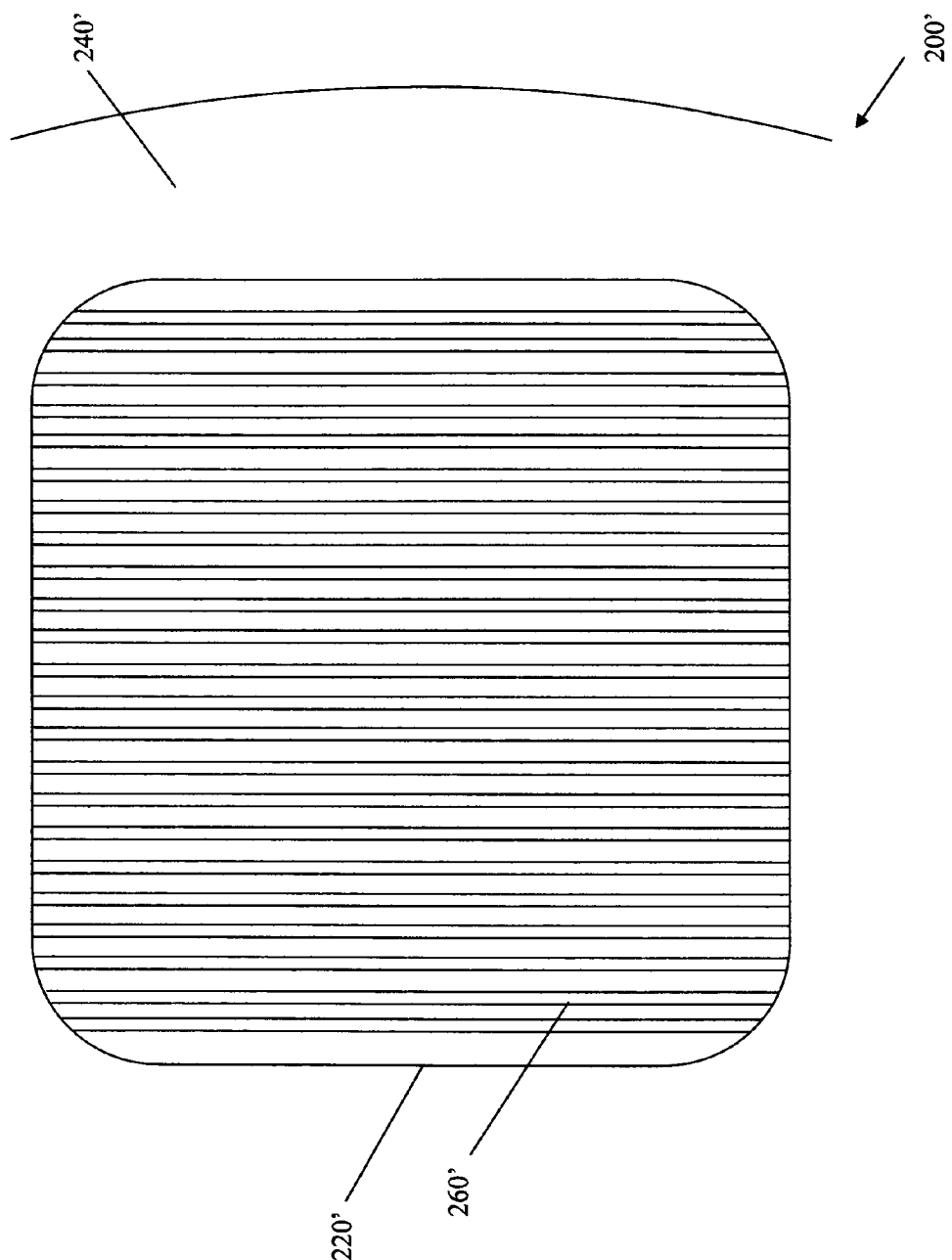
FIG. 8 is a plan view of an exemplary lid wafer, showing indentation features in the device cavities according to a second exemplary embodiment.
Figure 9:
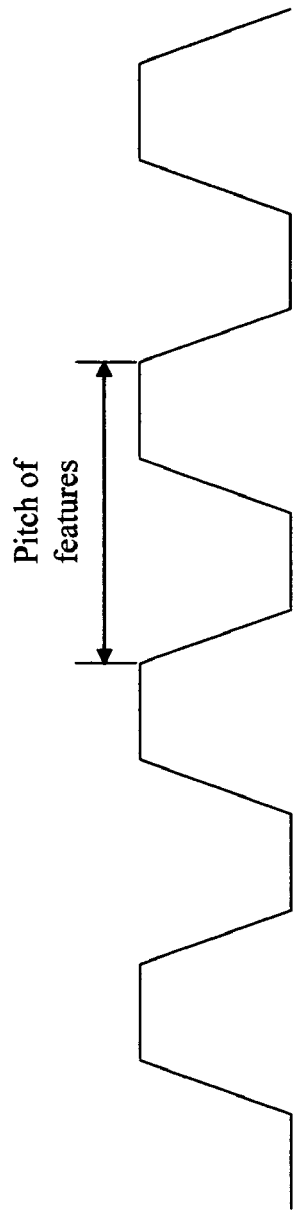
FIG. 9 is a cross sectional view of an exemplary lid wafer, showing indentation features in the device cavities according to a third exemplary embodiment.
Figure 10:
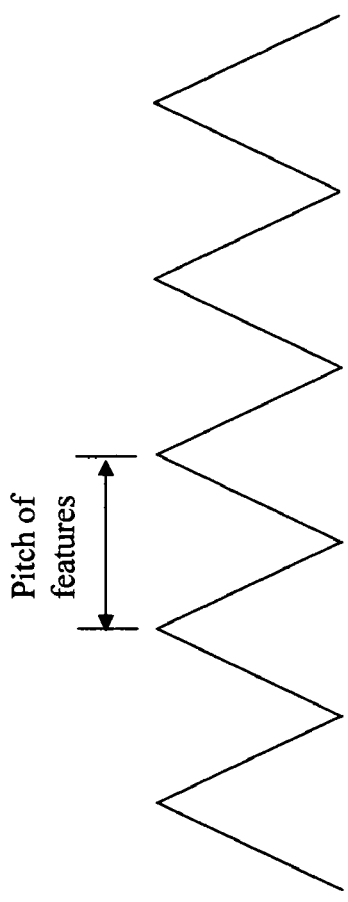
FIG. 10 is a cross sectional view of an exemplary lid wafer, showing indentation features in the device cavities according to a fourth exemplary embodiment.

Although the indented lid 200 is shown in FIGS. 3 and 4 as containing an array of identical spherical blind holes 260, it should be understood that this embodiment is exemplary only, and that the shapes patterned into the indented lid 200 may be any of a variety of shapes. FIG. 8 is a plan view of an exemplary lid wafer 200' according to a second exemplary embodiment. In this embodiment, the indentation features 260' are grooves rather than the blind holes of the first exemplary embodiment. The dimensions of the grooves 260' may be similar in cross section to the blind holes 260 of the first exemplary embodiment, about 6 µm wide and 8 µm deep and as shown in FIG. 5, however, the grooves 260' may extend across the entire surface of the device cavity 220'. The pitch between the grooves may also be similar, about 6 to about 250 µm or more. It should be understood that although the systems and methods are described with respect to a blind hole embodiment and a grooved embodiment, these embodiments are exemplary only, and that other shapes may be employed which increase the surface area of the deposited getter. Such other shapes of the indentations may be, for example, trapezoidal trenches as shown in FIG. 9, saw tooth trenches as shown in FIG. 10 or sinusoidal trenches, and may also depend on the processing techniques used to form the indentation features 260. For example, in FIG. 9, a wet etch may be used to form the indentation features 260 which may produce sidewalls which form a 57 degree angle with respect to a line parallel to a plane of the lid wafer. By placing the etched features an appropriate distance apart, virtually no lands will remain between the features, so that a saw tooth pattern with 57 degree sidewall slopes may result as shown in FIG. 10.

Figure 11:
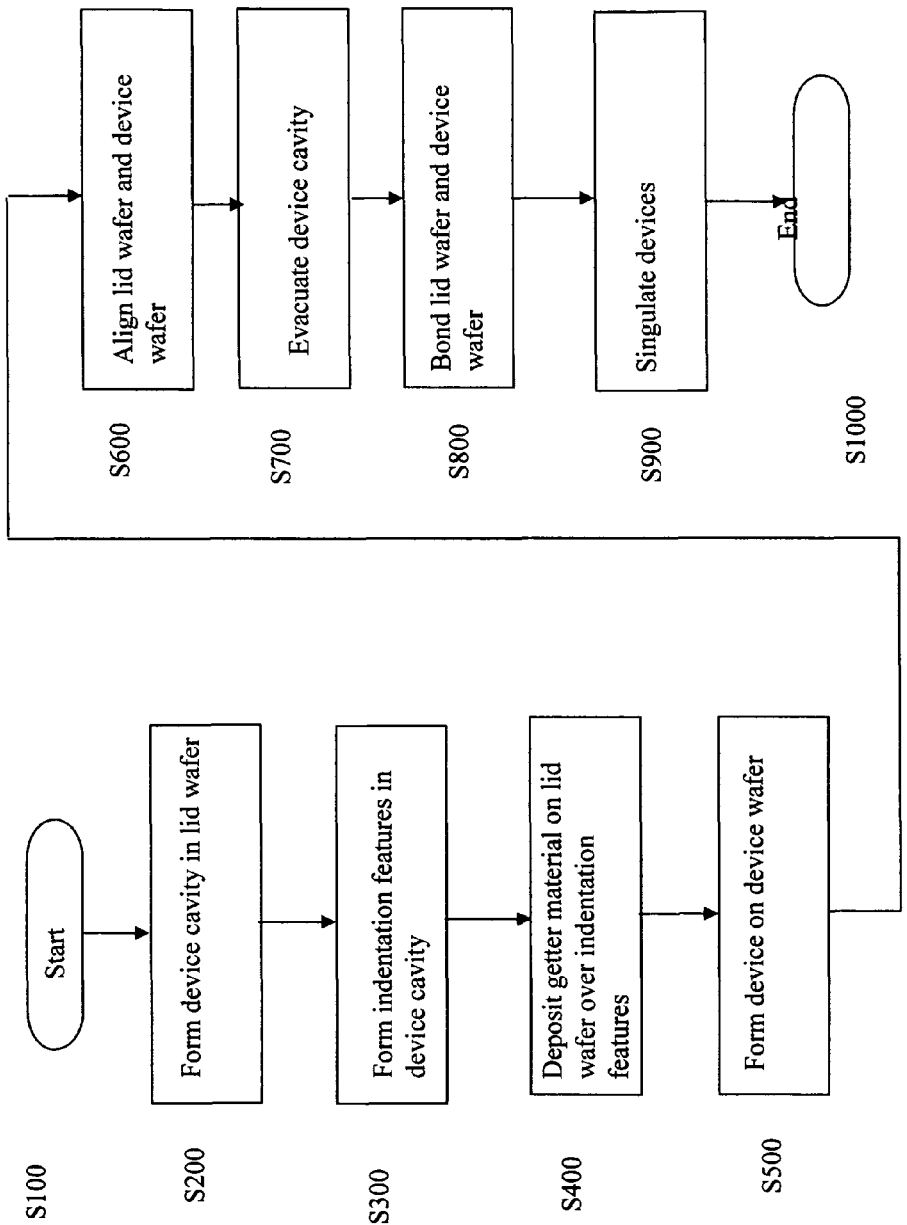
FIG. 11 is a flowchart of an exemplary method for manufacturing a vacuum encapsulated MEMS device.

FIG. 11 is an exemplary flow chart describing a method for manufacturing an encapsulated device. The method begins in step S100 and proceeds to step S200, wherein the device cavity is formed in the lid wafer. In step S300, the indentation features are formed in the device cavity of the lid wafer. The device cavity and indentation features may be formed by etching a patterned substrate in a liquid acid etchant or by deep reactive ion etching, for example. This may complete the preparation of the indented lid wafer. In step S400, the getter material is deposited over the patterned lid wafer. In various exemplary embodiments, the getter material may be deposited by sputter deposition, for example. In step S500, the device is formed on the device wafer. The device may be formed by any number of bulk machining or surface machining techniques, for example, sputtering, plating and etching. In step S600, the lid wafer is aligned with the device wafer so that the device cavity is registered over the device, and the wafers may be clamped together in a wafer assembly. In step S700, the device cavity is evacuated, and the gas environment within the wafer bonding tool may be replaced with a preferred gas. In step S800, lid wafer is bonded to the device wafer using, for example, a glass frit adhesive. In step S900, the devices are singulated to produce the individual vacuum encapsulated devices. The process ends in step S1000.

It should be understood that the steps shown in FIG. 11 need not necessarily be performed in the order indicated. For example, the indentation features may be formed before the device cavity, rather than after. Also, not all of the steps may be required to perform the method, for example, the devices may not necessarily be singulated, but may remain on the device wafer.

The systems and methods described here may result in improved getter performance because the indentation features increase the surface area of the getter which is exposed to the environment in the device cavity. The prior art methods increased the surface area by increasing the amount of getter material enclosed in the device cavity, which may increase the size of the cavity and therefore the size and cost of the packaged device.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the systems and methods are described with respect to a system using an array of blind holes formed in a lid wafer as the indentation features, it should be understood that this embodiment is exemplary only, and that the systems and methods disclosed here may be applied to any number of alternative shapes for providing indentation features within a device cavity of a lid wafer. Furthermore, the indented features may be formed by depositing material on the wafer surface, as well as removing material from the wafer surface. Accordingly, the exemplary implementations set forth above, are intended to be illustrative, not limiting.

What is claimed is:

1. A method for forming an encapsulated device, comprising:
    forming at least one indentation feature on at least a portion of a surface of at least one of two substrates;
    forming a getter material over the indentation feature;
    forming a device on at least one of the two substrates; and
    coupling the two substrates with an adhesive substance including embedded rigid particles, wherein the embedded rigid particles define a minimum separation between the substrates to define a cavity encapsulating the device, wherein the adhesive substance is at least one of a glass frit, an epoxy and a metal alloy, and wherein the embedded rigid particles are substantially spherical electrically non-conducting particles of at least about 10 microns in diameter, and wherein the embedded rigid particles define a separation between two surfaces forming the cavity.

2. The method of claim 1, wherein forming the at least one indentation feature comprises forming at least one of a blind hole, a groove, a post and a trench on at least a portion of a surface of the cavity.

3. The method of claim 1, further comprising:
    forming a cavity in at least one of the two substrates;
    aligning the substrates such that the cavity is located over the device; and
    evacuating the cavity.

4. The method of claim 3, further comprising:
    singulating the devices.

5. The method of claim 3, further comprising:
    adding a gas to the evacuated cavity, wherein the gas comprises at least one of sulfur hexafluoride ($SF_6$), helium (He), nitrogen ($N_2$), argon (Ar), and neon (Ne).

6. The method of claim 1, wherein forming the at least one indentation feature further comprises forming the at least one indentation feature using at least one of deep reactive ion etching, wet etching, ion milling, dry etching, stamping, molding, electroplating and ion beam deposition.

7. The method of claim 2, wherein a characteristic dimension of the at least one indentation feature is at least about ten times smaller than a width of the device cavity.

8. The method of claim 1, wherein at least one substrate comprises a substantially flat wafer of at least one of glass, Kovar, Invar, silicon, metal, and ceramic.

9. The method of claim 1, wherein coupling step comprises forming a substantially hermetic seal between the two substrates.

10. The method of claim 1, wherein a layer of getter material comprises at least one of zirconium, titanium, vanadium, niobium, tantalum and iron, and is between about 0.5 µm and about 3 µm thick.

11. The method of claim 1, wherein the device comprises at least one of a MEMS actuator, a MEMS sensor, and an infrared device and an integrated circuit.

12. The method of claim 1, wherein one of the substrates on which the device is formed comprises at least one of silicon, gallium arsenide, glass, quartz, ceramic and metal, and the other substrate is a substantially flat lid wafer comprising at least one of glass, Kovar, Invar, silicon, metal, and ceramic.

13. The method of claim 1, wherein the separation defined by the rigid particles alone forms the cavity enclosing the device and provides a clearance for the device.

14. The method of claim 1, wherein the adhesive substance comprises at least one of glass frit and a metal alloy.

15. The method of claim 1, wherein the adhesive substance comprises $AuIn_x$, wherein x is about 2.

16. The method of claim 1, wherein the embedded particles comprise at least one of alumina, silica, diamond, glass and sapphire spheres of at least about 10 µm diameter, providing a cavity with a clearance of at least about 10 µm.

17. The method of claim 1, wherein a top of the cavity is formed by a flat surface of a lid wafer and a bottom surface of the cavity is formed by a device wafer on which the device is formed, and the sides of the cavity are formed by the adhesive substance.

18. The method of claim 1, wherein forming the at least one indentation feature comprises forming at least one blind hole having a diameter of between about 5 microns and 10 microns, and a depth of about 8 microns to about 20 microns.

19. An apparatus for performing the method of claim 1, comprising:

means for forming at least one indentation feature on at least a portion of a surface of at least one of two substrates;

means for forming a getter material over the at least one indentation feature;

means for forming a device on at least one of the two substrates; and means for bonding two substrates with an adhesive substance including embedded rigid particles, wherein the embedded rigid particles define a minimum separation between the substrates to define a cavity encapsulating the device, wherein the adhesive substance is at least one of a glass frit, an epoxy and a metal alloy, and wherein the embedded rigid particles are substantially spherical electrically non-conducting particles of at least about 10 microns in diameter, and wherein the embedded rigid particles define a separation between two surfaces forming the cavity.

* * * * *